United States Patent
Kodama et al.

(10) Patent No.: US 9,128,143 B2
(45) Date of Patent: Sep. 8, 2015

(54) SEMICONDUCTOR DEVICE FAILURE ANALYSIS SYSTEM AND SEMICONDUCTOR MEMORY DEVICE

(71) Applicant: Kabushiki Kaisha Toshiba, Tokyo (JP)

(72) Inventors: Mami Kodama, Kanagawa (JP); Yoshikazu Iizuka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 13/827,650

(22) Filed: Mar. 14, 2013

(65) Prior Publication Data

US 2014/0043360 A1 Feb. 13, 2014

(30) Foreign Application Priority Data

Aug. 13, 2012 (JP) .................................. 2012-179561

(51) Int. Cl.
| | |
|---|---|
| *G06F 11/00* | (2006.01) |
| *G01R 31/26* | (2014.01) |
| *G06F 11/10* | (2006.01) |
| *G11C 29/00* | (2006.01) |
| *G11C 29/56* | (2006.01) |

(52) U.S. Cl.
CPC ............ *G01R 31/26* (2013.01); *G06F 11/1048* (2013.01); *G11C 29/006* (2013.01); *G11C 29/56008* (2013.01); *G11C 2029/5604* (2013.01)

(58) Field of Classification Search
CPC .......................... G06F 11/1048; G06F 11/1072
See application file for complete search history.

(56) References Cited

U.S. PATENT DOCUMENTS

| | | | |
|---|---|---|---|
| 8,372,720 B2 | 2/2013 | Fukuzumi et al. | |
| 8,479,063 B2* | 7/2013 | Iizuka | 714/723 |
| 2004/0153274 A1* | 8/2004 | Fukuda | 702/117 |
| 2011/0284946 A1 | 11/2011 | Kiyotoshi | |
| 2012/0011421 A1* | 1/2012 | Kodama et al. | 714/799 |
| 2012/0036405 A1* | 2/2012 | Iizuka | 714/723 |
| 2012/0068241 A1 | 3/2012 | Sakuma et al. | |

FOREIGN PATENT DOCUMENTS

| | | |
|---|---|---|
| JP | 2000-306395 | 11/2000 |
| JP | 2002-134569 | 5/2002 |
| JP | 2002-162449 | 6/2002 |
| JP | 2002-288995 | 10/2002 |
| JP | 2010-54208 | 3/2010 |
| JP | 2011-108787 | 6/2011 |
| JP | 2012-18052 | 1/2012 |

OTHER PUBLICATIONS

Microsoft Computer Dictionary, Microsoft Press, 4th Ed., 1999, p. 379.*

* cited by examiner

*Primary Examiner* — Christopher McCarthy
(74) *Attorney, Agent, or Firm* — Oblon, McClelland, Maier & Neustadt, L.L.P.

(57) ABSTRACT

A semiconductor device failure analysis system according to an embodiment of the present invention includes a memory configured to be capable of retaining an initial display information; and a control unit configured to generate a first image based on a configuration information of the semiconductor device and a plurality of fail bit information of the semiconductor device, the semiconductor device including a three-dimensional memory cell array, and to generate a second image from the first image based on the initial display information, the second image corresponding to part of the plurality of fail bit information. The semiconductor device failure analysis system according to the embodiment further includes a display configured to be capable of initially displaying the second image.

17 Claims, 20 Drawing Sheets

DISPLAY OF OVERLAP BETWEEN LAYER 0
AND LAYER 1

COLUMN FAILURE

BIT FAILURE

COLUMN FAILURE FBM IMAGE DATA

BIT FAILURE FBM IMAGE DATA

FIG.10

| PRODUCT NAME | LAYER |
|---|---|
| AAAAAAA | 0, 1, 2, 3 |
| BBBBBBB | 0, 1+2+3+4+5+6, 7 |

FIG.11

| PRODUCT NAME | FAILURE MODE |
|---|---|
| AAAAAAA | Mode 1, Mode 2, Mode 3, Mode 4, Mode 5, Mode 6, Mode 7, Mode 8, Mode 9, Mode 10 |
| BBBBBBB | Mode 1 + Mode 2 + Mode 3, Mode 4 + Mode 5 |

FIG.12

| | PRODUCT INFORMATION | LAYER INFORMATION |
|---|---|---|
| FBM | AAAAAAA / LOT A / WAFER A / FBM | 0, 1, 2, 3 |
| | BBBBBBB / LOT B / WAFER B / FBM | 0, 1+2+3+4+5+6, 7 |
| FBM IN EACH FAILURE MODE | AAAAAAA / LOT A / WAFER A / FAILURE MODE / Mode 1 | 0, 1, 2, 3 |
| | AAAAAAA / LOT A / WAFER A / FAILURE MODE / Mode 2 | 0, 1, 2, 3 |
| | AAAAAAA / LOT A / WAFER A / FAILURE MODE / Mode 3 | 0, 1, 2, 3 |
| | AAAAAAA / LOT A / WAFER A / FAILURE MODE / Mode 4 | 0, 1, 2, 3 |
| | ... | |
| | AAAAAAA / LOT A / WAFER A / FAILURE MODE / Mode 10 | 0, 1, 2, 3 |
| | BBBBBBB / LOT B / WAFER B / FAILURE MODE / Mode 1 + Mode 2 + Mode 3 | 0, 1+2+3+4+5+6, 7 |
| | BBBBBBB / LOT B / WAFER B / FAILURE MODE / Mode 4 + Mode 5 | 0, 1+2+3+4+5+6, 7 |

FIG.13

| | | |
|---|---|---|
| FBM DIRECTORY | $ROOT / PRODUCT NAME / LOT NUMBER / WAFER NUMBER / FBM / | Layer0.png |
| | | Layer1.png |
| | | Layer2.png |
| | | Layer3.png |
| | | Layer4.png |
| FBM DIRECTORY IN EACH FAILURE MODE | $ROOT / PRODUCT NAME / LOT NUMBER / WAFER NUMBER / FAILURE MODE / Mode 1 / | Layer0.png |
| | | Layer1.png |
| | | Layer2.png |
| | | Layer3.png |
| | | Layer4.png |
| | $ROOT / PRODUCT NAME / LOT NUMBER / WAFER NUMBER / FAILURE MODE / Mode 2 / | Layer0.png |
| | | Layer1.png |
| | | Layer2.png |
| | | Layer3.png |
| | | Layer4.png |
| | | ... |

FIG.14

| PRODUCT NAME | INITIAL DISPLAY LAYER |
|---|---|
| AAAAAAA | 0 |
| BBBBBBB | 0, 5 |

FIG.15

| PRODUCT NAME | INITIAL DISPLAY FAILURE MODE |
|---|---|
| AAAAAAA | Mode 1, Mode 5, Mode 10 |
| BBBBBBB | Mode 1 + Mode 2 + Mode 3, Mode 6 |

FIG.21A
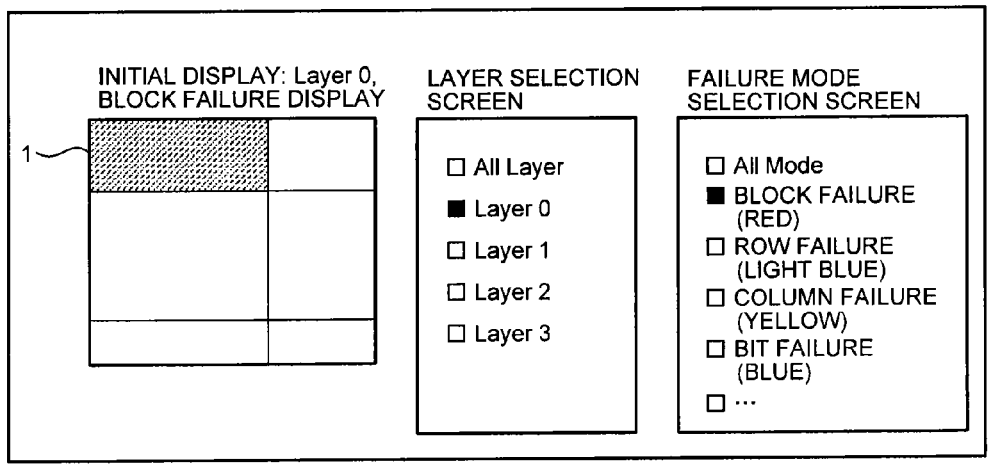
FIG.21B
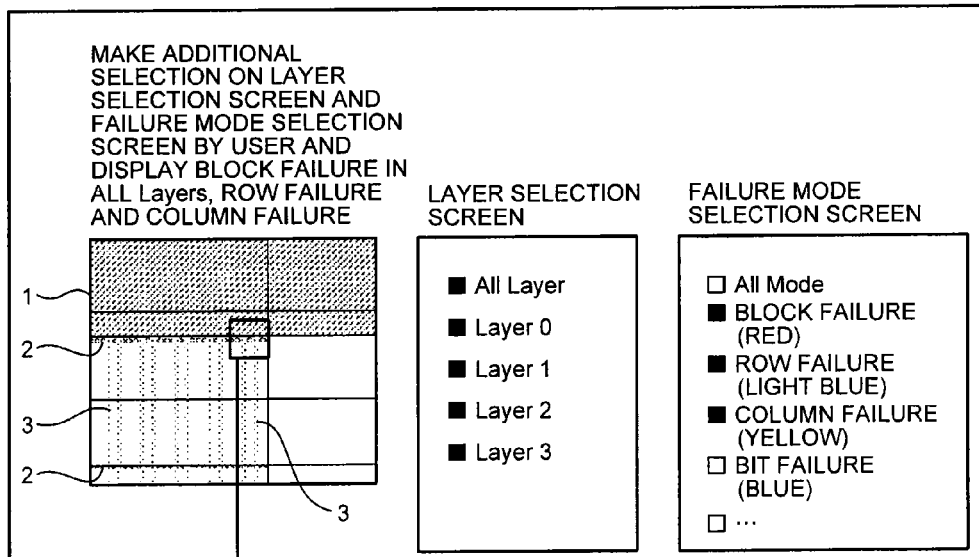
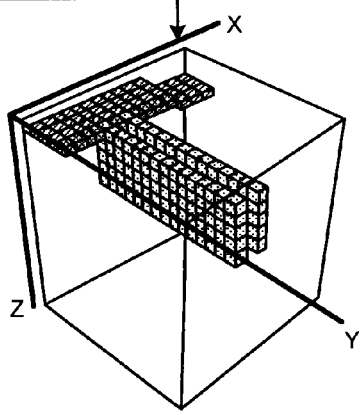

FIG.23

| TEXT FILE (100 HALF-WIDTH DIGITS) | | | | | |
|---|---|---|---|---|---|
| PRODUCT NAME (10 HALF-WIDTH DIGITS) | LOT NUMBER (10) | WAFER NUMBER (10) | TEST NAME (10) | TEST DATE (20) | Filler (30) | INITIAL DISPLAY (10) |
| AAAAAAA | Lot A | Wafer A | Test A | 20120412 | Filler | 02 |

SEMICONDUCTOR DEVICE FAILURE ANALYSIS SYSTEM AND SEMICONDUCTOR MEMORY DEVICE

CROSS-REFERENCE TO RELATED APPLICATIONS

This application is based upon and claims the benefit of priority from Japanese Patent Application No. 2012-179561, filed on Aug. 13, 2012; the entire contents of which are incorporated herein by reference.

FIELD

Embodiments relate generally to a semiconductor device failure analysis system and a semiconductor memory device.

BACKGROUND

Along with the miniaturization, high integration and high structural complexity of semiconductor devices, a failure analysis thereof has become an increasingly difficult task. Generally, in a memory device, bit pass/fail data (Fail Bit) is collected by a semiconductor test device and an FBM (fail bit map) is generated to make an analysis thereof. A logical address of a fail bit collected by the test device is converted into a physical address, FBM image data is generated based on the conversion result, and the generated FBM image data is retained. The FBM image data is displayed at the display request of an analyzer. Also, there is a method that analyzes a plurality of FBMs of test patterns and test conditions in an overlapped manner.

BRIEF DESCRIPTION OF THE DRAWINGS

FIG. 10 is a diagram illustrating an example of image generation master (layer) information according to Embodiment 1;

FIG. 11 is a diagram illustrating an example of image generation master (failure mode) information according to Embodiment 1;

FIG. 12 is a diagram illustrating an example of an FBM data management table according to Embodiment 1;

FIG. 13 is a diagram illustrating an example of an FBM managing method for each failure mode and FBM according to Embodiment 1;

FIG. 14 is a diagram illustrating an example of initial display information (layer) according to Embodiment 1;

FIG. 15 is a diagram illustrating an example of initial display information (failure mode) according to Embodiment 1;

FIGS. 21A and 21B are diagrams illustrating an example of an FBM display in each failure mode in each layer according to Embodiment 1;

FIG. 23 is a diagram illustrating an example of initial display layer information in tester output data according to Embodiment 2;

DETAILED DESCRIPTION

A semiconductor device failure analysis system according to an embodiment of the present invention includes a memory configured to be capable of retaining an initial display information; and a control unit configured to generate a first image based on a configuration information of the semiconductor device and a plurality of fail bit information of the semiconductor device, the semiconductor device including a three-dimensional memory cell array, and to generate a second image from the first image based on the initial display information, the second image corresponding to part of the plurality of fail bit information. The semiconductor device failure analysis system according to the embodiment further includes a display configured to be capable of initially displaying the second image.

Hereinafter, a semiconductor device failure analysis system and a semiconductor memory device according to embodiments will be described in detail with reference to the accompanying drawings. In addition, the present invention is not limited by these embodiments.

Embodiment 1

Figure 1:
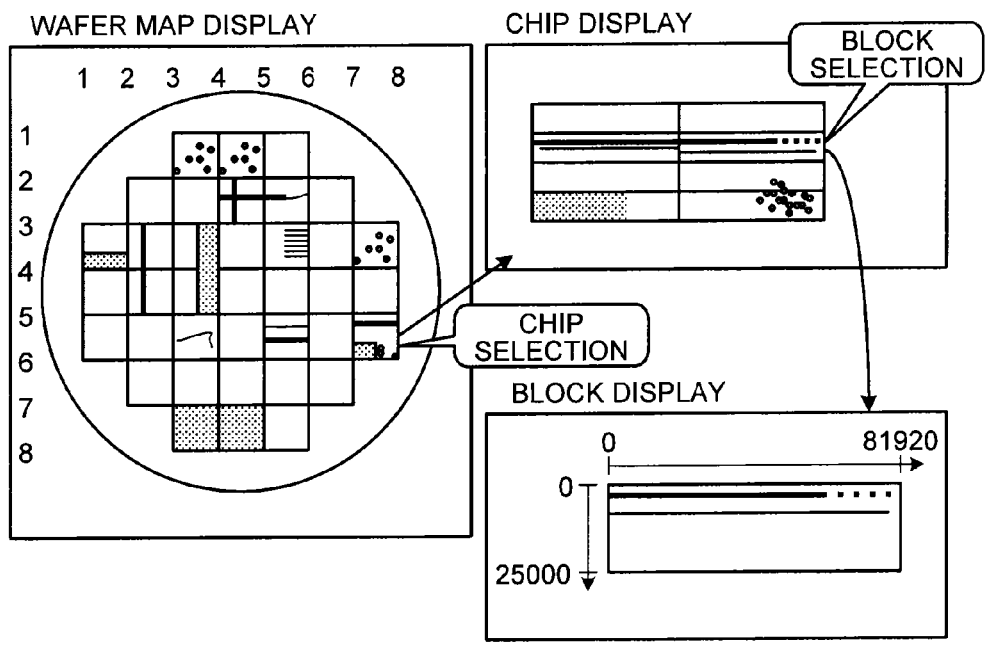
FIG. 1 is a diagram illustrating an example of the fail bit data display of a semiconductor memory according to Embodiment 1.

Generally, in a memory device, bit pass/fail data (Fail Bit) is collected by a semiconductor test device and a fail bit map (FBM) is generated to make an analysis thereof. A logical address of a fail bit collected by the test device is converted into a physical address, FBM image data is generated based on the conversion result, and the generated FBM image data is retained. The FBM image data is displayed at the display request of an analyzer. FIG. 1 illustrates an example of an FBM display. Due to high integration, there is a case where the gross number of chips of a wafer reaches hundreds of chips, and the number of bit data per chip becomes the order of several giga bits. In an FBM analysis, as illustrated in FIG. 1, a wafer map is displayed to check the distribution of failures on a wafer, and then a chip with a noticeable failure is displayed to check details thereof. The chip is divided into a plurality of blocks, and a fail bit of each block is displayed and analyzed. Since a highly-contracted image is used to accommodate an FBM of one wafer on a PC screen, the details thereof are difficult to know unless displayed in an enlarged manner.

Figure 2:
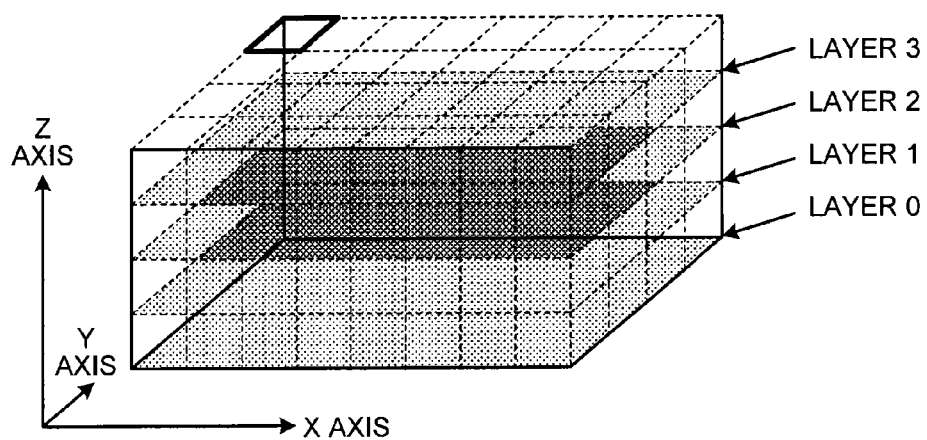
FIG. 2 is a diagram illustrating an example of the fail bit map of a three-dimensional (3D) memory according to Embodiment 1.
Figure 3:
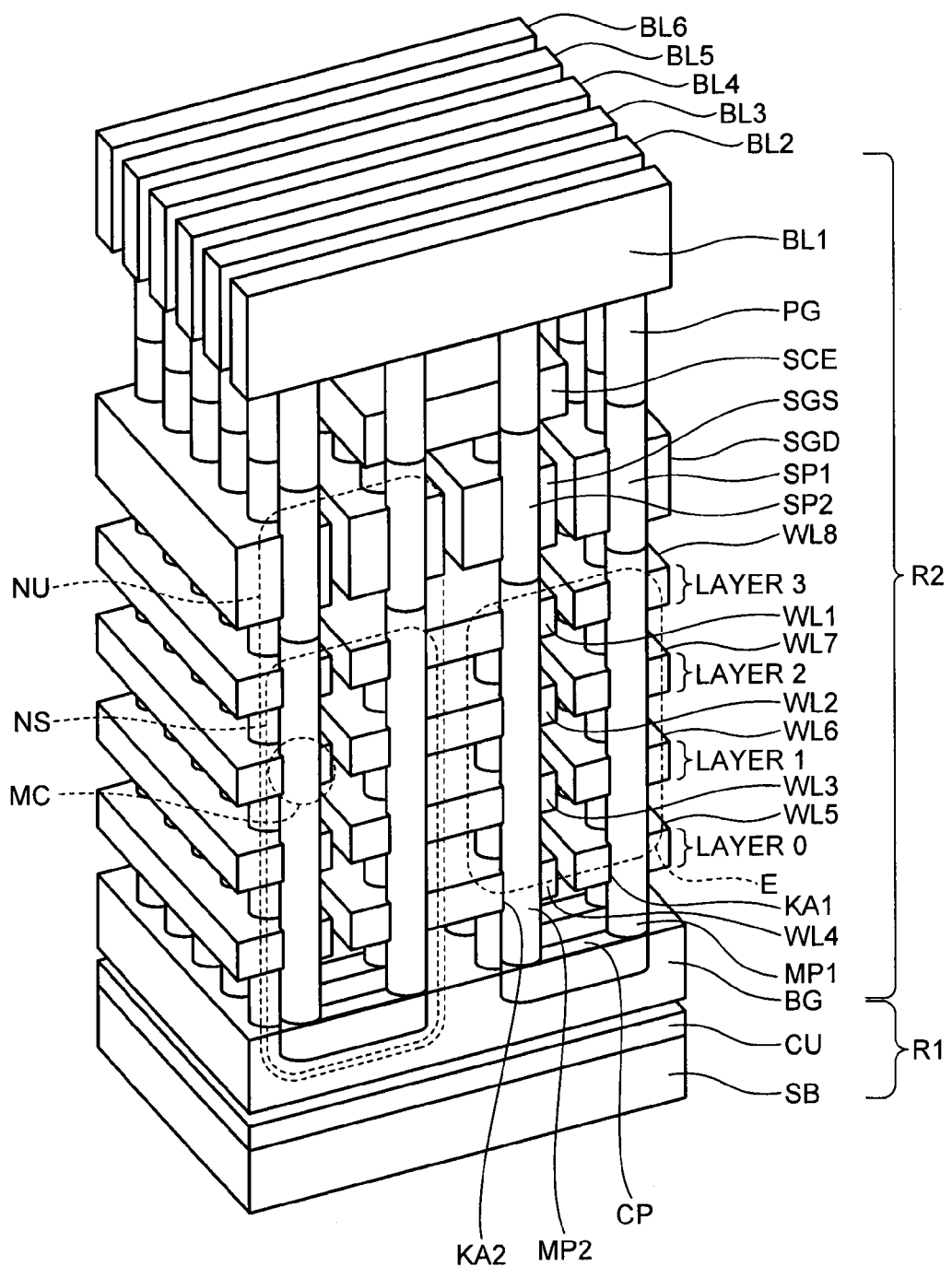
FIG. 3 is a diagram illustrating an example of the structure of a semiconductor memory having a three-dimensional (3D) structure according to Embodiment 1.

FIG. 2 illustrates an example of a FBM data managing method of a semiconductor memory having a three-dimensional (3D) structure. Since the size in a Z-axis direction is smaller than the size in an X-axis direction and the size in a Y-axis direction, the Z-axis direction is set as a layer and X axis/Y axis two-dimensional (2D) FBMs are retained as many as the number of layers. FIG. 2 illustrates a configuration including a two-dimensional (2D) FMB of four layers: a layer 0, a layer 1, a layer 2, and a layer 3. FIG. 3 illustrates an example of the structure of a semiconductor memory having a three-dimensional (3D) structure.

FIG. 3 is a perspective view illustrating a schematic configuration example of a memory cell array of a nonvolatile semiconductor memory device. In FIG. 3, a semiconductor substrate SB is provided with a circuit region R1, and a memory region R2 is provided on the circuit region R1. Also, the circuit region R1 and the memory region R2 may be provided at separate substrates. In the circuit region R1, a circuit layer CU is formed on the semiconductor substrate SB. Also, in the memory region R2, a back-gate layer BG is formed on the circuit layer CU, and a connection layer CP is formed at the back-gate layer BG. On the connection layer CP, pillar members MP1 and MP2 (pillar semiconductors respectively covered with insulation films) are disposed to be adjacent to each other. The lower ends of the pillar members MP1 and MP2 are connected to each other through the connection layer CP. Also, four layers of word lines WL4 to WL1 are sequentially stacked on the connection layer CP, and four layers of word lines WL5 to WL8 are sequentially stacked to be adjacent respectively to the word lines WL4 to WL1. A memory cell is formed in the pillar member MP2 contacting the word lines WL4 to WL1, and a memory cell is formed in the pillar MP1 contacting the word lines WL5 to WL8. Therefore, for example, an assembly of memory cells formed in a layer including the word lines WL4 and WL5 corresponds to the above one layer that is the layer 0 of FIG. 2. Likewise, an assembly of memory cells formed in a layer including the word lines WL3 and WL6 corresponds to the layer 1, an assembly of memory cells formed in a layer including the word lines WL2 and WL7 corresponds to the layer 2, and an assembly of memory cells formed in a layer including the word lines WL1 and WL8 corresponds to the layer 3. That is, in FIG. 3, four parallel layers are arranged in the extension direction of the pillar members MP1 and MP2. The word lines WL5 to WL8 are penetrated by the pillar member MP1 and the word lines WL1 to WL4 are penetrated by the pillar member MP2, thereby forming a NAND string NS. Also, pillar members SP1 and SP2 are formed respectively on the pillar members MP1 and MP2. Also, a select gate electrode SGD penetrated by the pillar member SP1 is formed on the uppermost word line WL8, and a select gate electrode SGS penetrated by the pillar member SP2 is formed on the uppermost word line WL1. Also, a source line SCE connected to the pillar member SP2 is provided on the select gate electrode SGS, and bit lines BL1 to BL6 connected through a plug PG to the pillar member SP1 are formed on the source line SCE in each column. Also, the pillar members MP1 and MP2 may be disposed at the intersections of the bit lines BL1 to BL6 and the word lines WL1 to WL8. Also, herein, although a layer focused on a memory cell is treated, the above SGD, SGS and BG may be treated as a layer.

Figure 4A:
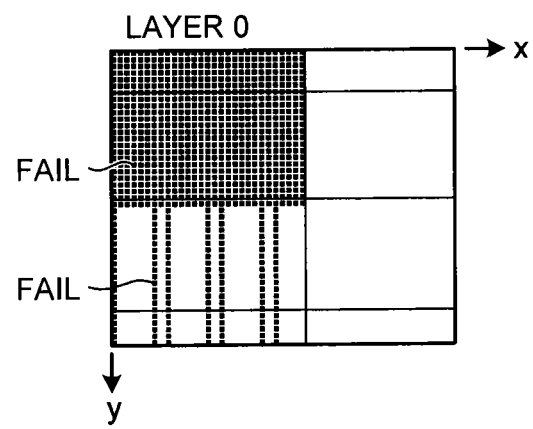
FIGS. 4A and 4B are diagrams illustrating an example of an FBM image in each layer according to Embodiment 1.
Figure 4B:
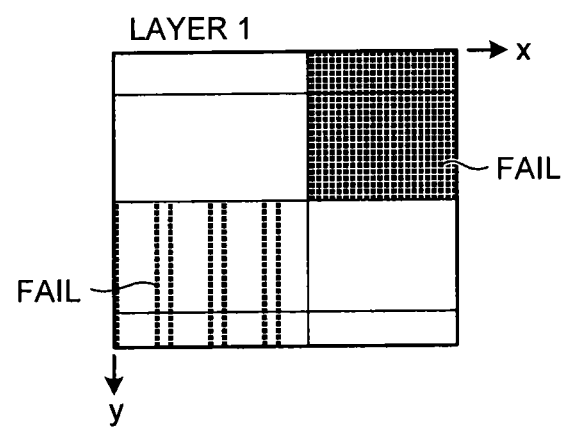
Figure 5:
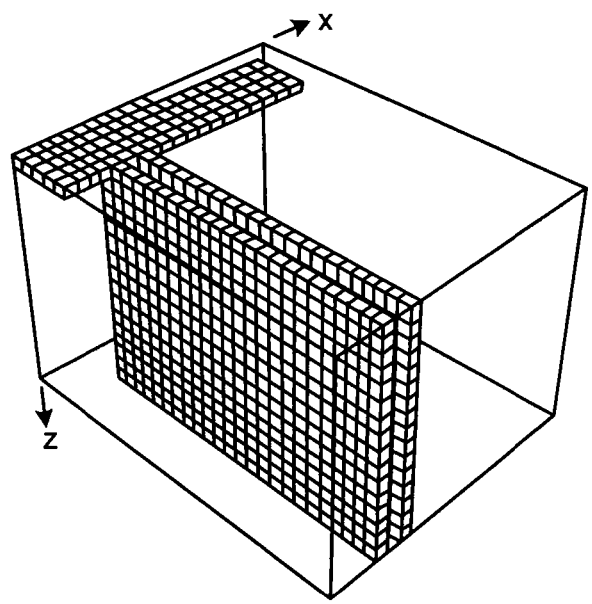
FIG. 5 is a diagram illustrating an example of a three-dimensional (3D) FBM display according to Embodiment 1.
Figure 6:
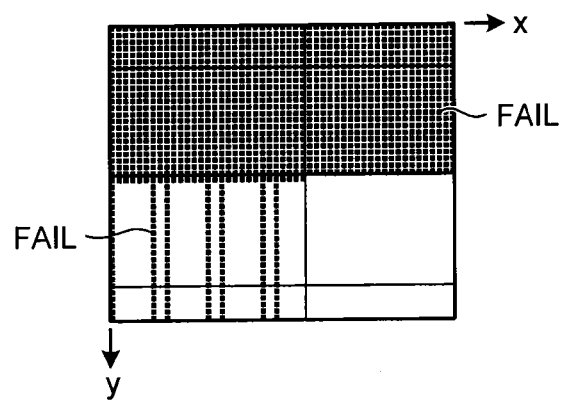
FIG. 6 is a diagram illustrating an example of a layer-overlap FBM (two-dimensional (2D)) display according to Embodiment 1.

FIGS. 4A and 4B illustrate an example of an FBM image in each of the layer 0 and the layer 1. FIGS. 4A and 4B illustrates the occurrence of a failure in the memory cell inside each layer (X axis/Y axis 2D plane), and a black region represents a fail (failure) in each layer (a white region represents a pass (good)). Also, herein, regardless of failure modes, whether each cell is fail (failure) or pass (good) is represented by black and white. A three-dimensional (3D) FBM is capable of three-dimensional (3D) display as illustrated in FIG. 5. Sections in the respective layers perpendicular to the Z axis in FIG. 5 correspond to FIGS. 4A and 4B. In the representation of FIG. 5, the entire FBM configuration can be suitably understood, but the detailed conditions are difficult to know. Therefore, in order to understand the detailed conditions of failure occurrence, an expansion/reduction function, a three-dimensional (3D) display/2D (specific layer) display switching function, and the like are required. Therefore, as illustrated in FIG. 6, the 3D failure analysis system can also display the occurrence condition of a fail (failure) by overlapping the X-axis/Y-axis 2D FBMs with each other, which are represented in FIGS. 4A and 4B with respect to each layer. The size of the 3D FBM in the Z-axis direction may reach tens of layers. When the number of layers increases, as many FBM images as the number of layers are overlapped and displayed and thus the time taken to display the same increases. On the other hand, when tens of FBM images of the entire layer are overlapped and displayed, it is difficult to identify the layer in which a failure has occurred.

Figure 7:
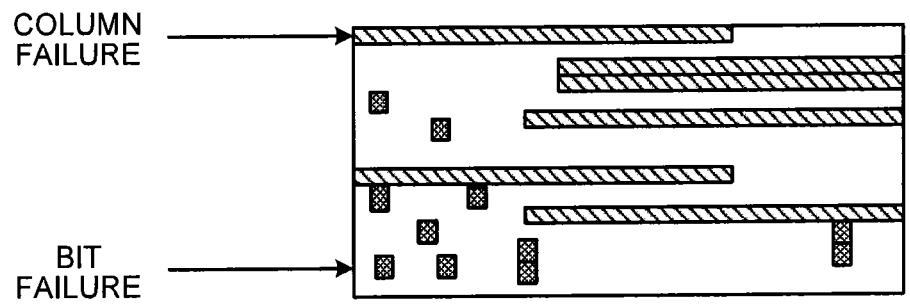
FIG. 7 is a diagram illustrating an example of failure mode classification by fail bit configuration according to Embodiment 1.

On the other hand, a general analysis is that specifies a failure factor by classifying failure modes according to occurrence configurations of fail bits. In order to specify the failure factor, the failure mode is defined based on the configuration by an expert that has an extensive knowledge of design/device/process. FIG. 7 illustrates an example of classifying a failure mode with respect to each fail bit configuration and displaying a fail bit in each failure mode in a color classified manner, in which a bit failure and a column failure occur. Examples of the bit failure include a single-bit failure occurring independently, a vertical 2-bit failure occurring consecutively in the vertical direction, and a horizontal 2-bit failure occurring consecutively in the horizontal direction, and the failure modes may be defined and classified in detail according to the purpose of an analysis. A failure mode classifying system automating this failure mode classification has been developed.

Figure 8A:
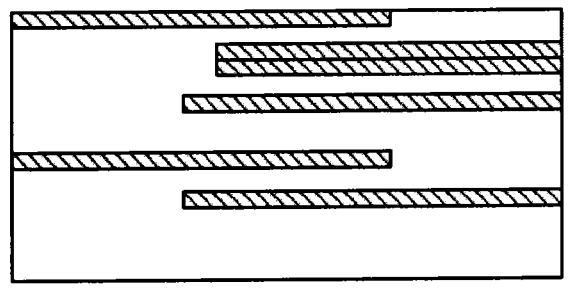
FIGS. 8A and 8B are diagrams illustrating an example of an FBM image in each failure mode according to Embodiment 1.
Figure 8B:
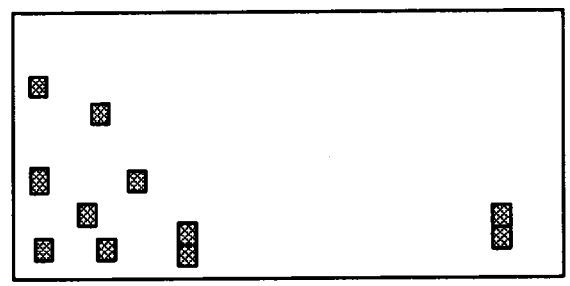

According to the increased complexity of semiconductor structures, there is a case where failure modes are classified into tens of types and analyzed, and tens of types of failure modes occur in the case of frequent failures. FIGS. 8A and 8B illustrate an example of an FBM image in each failure mode. FIG. 8A illustrates an FBM image of a column failure, and FIG. 8B illustrates an FBM image of a bit failure. In order to classify an FBM in each failure mode by color and display the same, FBM modes are divided, generated and retained in advance with respect to each failure mode. When the number of occurring failure modes increases to several dozen, as many FBM images as the number of occurring failure modes are overlapped and displayed and thus the time taken to display the same increases. On the other hand, when tens of image data are overlapped and displayed, colors are difficult to identify in an FBM with a high image contraction rate, and there is a case where a target failure is missed.

Furthermore, in the FBM color classification display of each failure mode of a semiconductor memory having a three-dimensional (3D) structure, as many FBM image data as the number of layers×failure modes are overlapped and displayed and thus the time taken to display the same increases.

Figure 9:
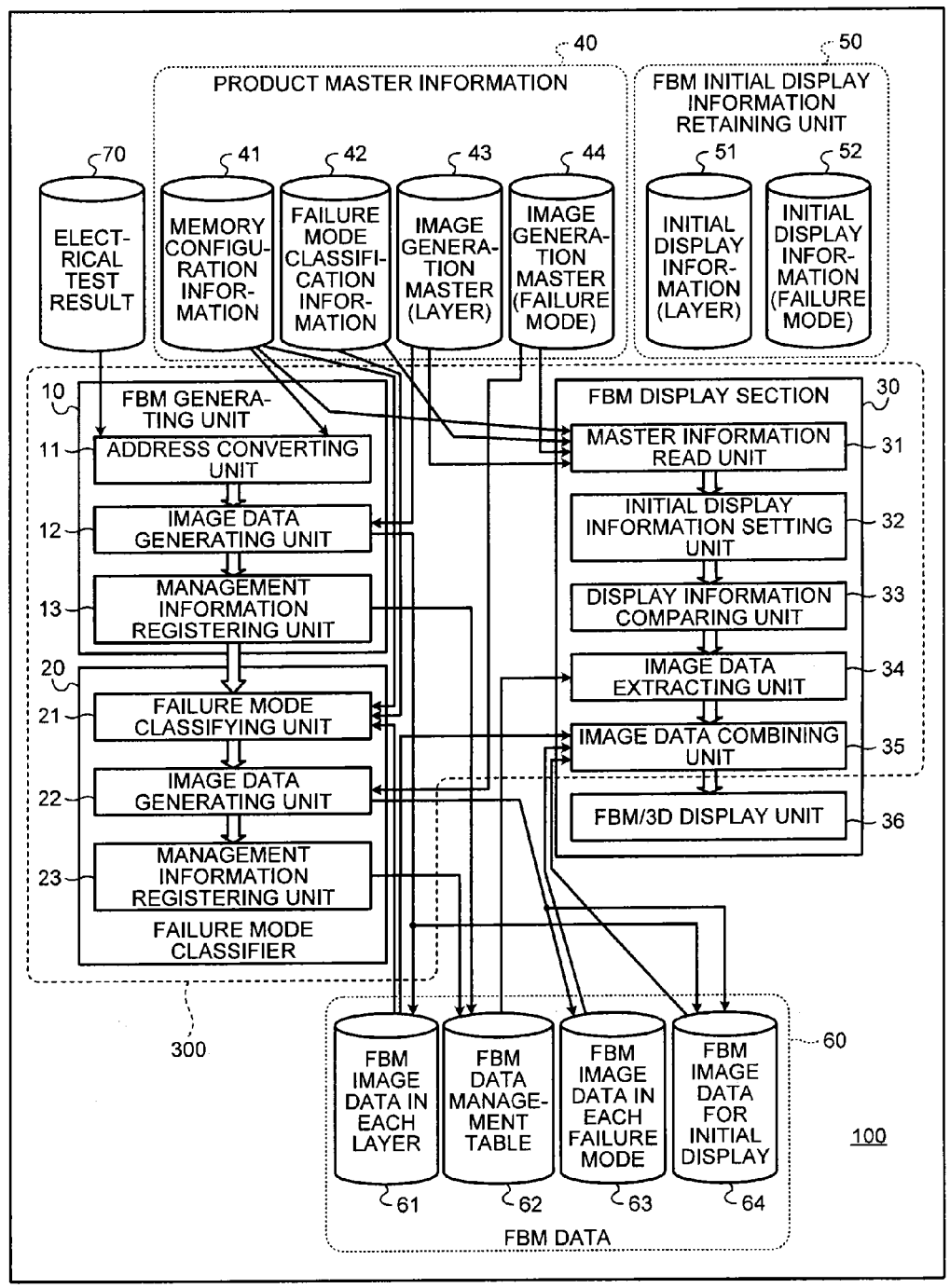
FIG. 9 is a diagram illustrating an example of the configuration of a semiconductor device failure analysis system according to Embodiment 1.

FIG. 9 is a diagram illustrating an example of the configuration of a semiconductor device failure analysis system 100 according to Embodiment 1. The failure analysis system 100 includes at least an FBM generating unit 10 generating FBM data 60, a failure mode classifier 20 classifying a mode in each fail bit occurrence configuration, and an FBM display section 30 displaying an FBM. The failure analysis system 100 further includes product master information 40 retaining information such as a screen generating master or a memory configuration, an FBM initial display information retaining unit 50 retaining information about an initial display, an FBM data 60 retaining FBM image data or the like generated by the FBM generating unit 10, and an electrical test result 70 that is failure analysis result data collected by the semiconductor test device. A memory includes product master information 40, the FBM initial display information retaining unit 50, the FBM data 60, and the electrical test result 70.

The FBM generating unit 10 includes an address converting unit 11, an image data generating unit 12, and a management information registering unit 13. The respective units will be described below. The address converting unit 11 has a function of converting a logical address (on a functional design) of a failure cell detected from the electrical test result into a physical address on a chip according to the memory configuration information. The image data generating unit 12 has a function of generating address-converted FBM image data. The management information registering unit 13 has a function of registering layer information generating image data with respect to each product information of a processing target.

The failure mode classifier 20 includes a failure mode classifying unit 21, an image data generating unit 22, and a management information registering unit 23. The failure mode classifying unit 21 has a function of inputting FBM image data and classifying a failure mode in each failure bit configuration. As will be described later, the image data generating unit 22 and the management information registering unit 23 have substantially the same functions as the image data generating unit 12 and the management information registering unit 13 of the FBM generating unit 10.

The FBM display section 30 includes a master information read unit 31, an initial display information setting unit 32, a display information comparing unit 33, an image data extracting unit 34, an image data combining unit 35, and an FBM/3D display unit 36. The master information read unit 31 has a function of reading information from the image generation master (layer) 43 and the image generation master (failure mode) 44 included in the product master information 40. The initial display information setting unit 32 has a function of reading initial display information (layer) 51 and initial display information (failure mode) 52 that is information about an initial display retained in the FBM initial display information retaining unit 50. The display information comparing unit 33 has a function of comparing the image generation master information with the initial display information and determining a failure mode and a layer to be displayed. The image data extracting unit 34 has a function of extracting requested product information with reference to an FBM data management table 62. The image data combining unit 35 has a function of reading and combining image data of a display target based on the product information extracted by the image data extracting unit 34. The FBM/3D display unit 36 has a function of displaying an FBM according to a request such as two-dimensional (2D) display, three-dimensional (3D) display, layer switching, or failure mode switching from a user interface. A control unit 300 includes the FBM generating unit 10, the failure mode classifier 20, the master information read unit 31, the initial display information setting unit 32, the display information comparing unit 33, the image data extracting unit 34, and the image data combining unit 35.

FIG. 10 illustrates an example of the image generation master (layer) 43, in which a layer generating image data is described with respect to each product name. A product "AAAAAAA" is a comma separated value that describes a plurality of layer information and represents layer division into 0, 1, 2, and 3. Even when a layer 4 or more is present as a memory configuration of the product "AAAAAAA" in the Z-axis direction, their image data is not generated according to the image generation master (layer) 43. In a product "BBBBBBB", "0" represents using one image of a layer 0, and "1+2+3+4+5+6" describing layer information consecutively by a sign "+" represents using one image by overlapping layers 1, 2, 3, 4, 5 and 6, and "7" represents using one image of a layer 7. The product "BBBBBBB" represents generating three FBM image data.

FIG. 11 illustrates an example of the image generation master (failure mode) 44, in which failure mode information generating image data is recorded with respect to each product. A product "AAAAAAA" describes a plurality of failure mode information by comma separated values, and represents generating 10 image data by division into modes 1 to 10. A product ""BBBBBBB" describes failure mode information by a sign "+", in which "Mode1+Mode2+Mode3" represents using one image by overlapping three failure modes Mode1, Mode2 and Mode3 and "Mode4+Mode5" represents using one image by overlapping two failure modes Mode 4 and Mode5. The product "BBBBBBB" represents generating FBM image data in each of two failure modes.

FIG. 12 illustrates an example of the FBM data management table 62, in which a failure mode and a layer generating an image are registered with respect to each product information. The registered contents include product information such as a product name, a lot number, and a wafer number, and information about a failure mode and a layer generating an image. FIG. 12 illustrates a method of registering a failure mode and a layer generating an image in the management table. However, a failure mode and a layer generating an image may not be registered in the management table. For example, as illustrated in FIG. 13, layer information such as "Layer0.png" is retained in the file name of image data, and a directory is divided and managed with respect to each of the product name, the lot number, and the wafer number. In the case of an FBM in each failure mode, a directory for each failure mode is further added and managed.

FIG. 14 illustrates an example of initial display information (layer) 51. A layer to be initially displayed is defined with respect to each product. When there are a plurality of layers to be initially displayed, a description thereof is made by comma separated values. The initial display information may be managed collectively in the system, may be managed in each analysis group, or may be managed separately in each user.

FIG. 15 illustrates an example of initial display information (failure mode) 52. A failure mode to be initially displayed is defined with respect to each product. When there are a plurality of failure modes to be initially displayed, a description thereof is made by comma separated values. Like the layer initial display information, the initial display information may be managed collectively in the system, may be managed in each analysis group, or may be managed separately.

Also, a failure mode to be initially displayed may be defined with respect to each wafer. For example, there is a method that initially displays upper five failure modes with a large failure occurrence count with respect to each wafer. In this method, the failure mode to be initially displayed is different according to wafers.

Figure 16:
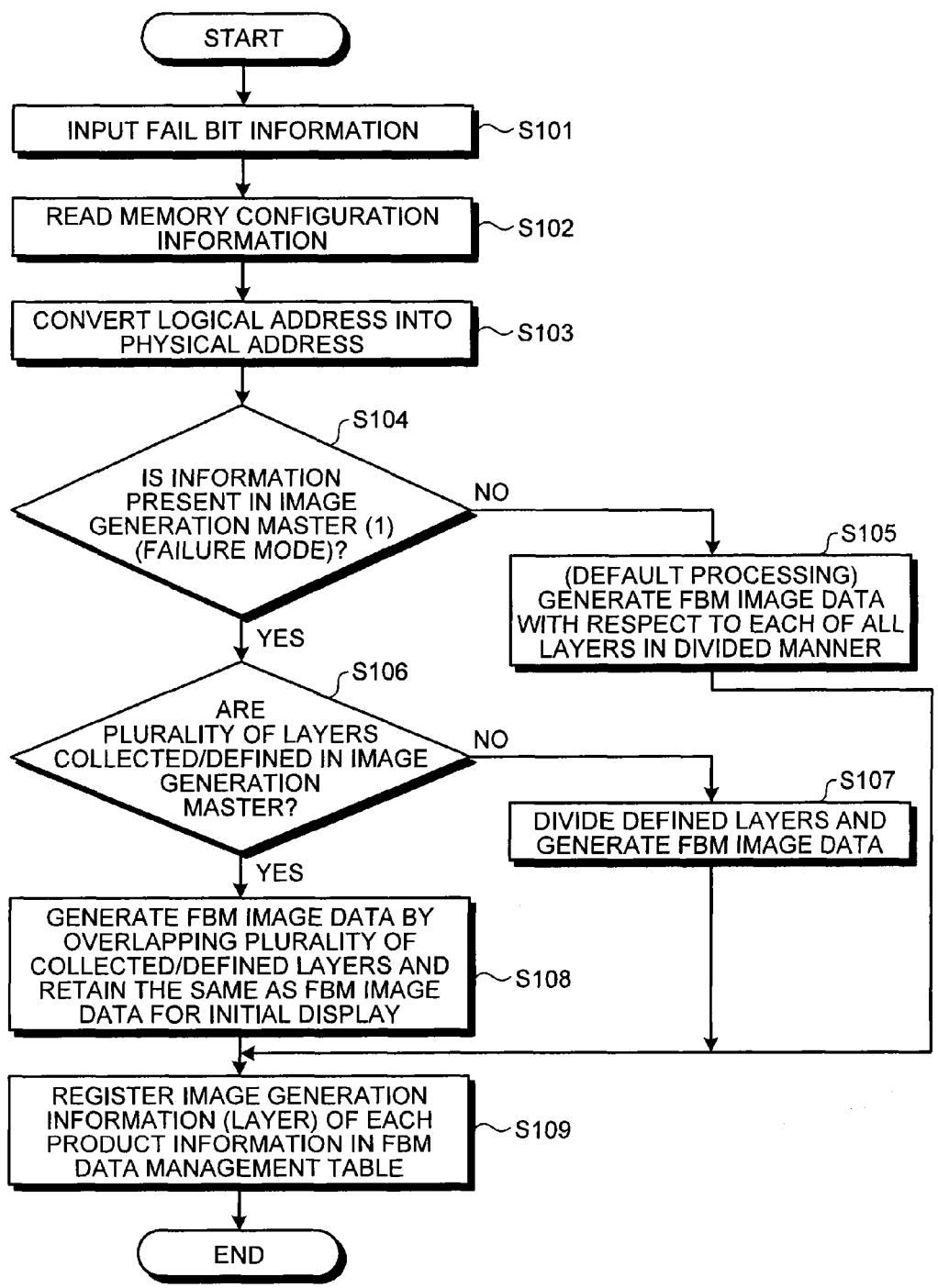
FIG. 16 is a diagram illustrating an example of an FBM generation flow according to Embodiment 1.

FIG. 16 illustrates an example of an FBM generation flow according to Embodiment 1. In step S101, the FBM generating unit 10 reads the electrical test result 70 of FIG. 9 collected by the semiconductor test device as the fail bit information (failure analysis result data) into a calculator memory. The failure analysis system 100 is constructed on a distributed system including a single server or a plurality of servers. Therefore, although not specifically illustrated in FIG. 9, the calculator memory is, for example, a memory of a server functioning as the FBM generating unit 10. In addition, in step S102, the FBM generating unit 10 reads memory configuration information 41 (FIG. 9) such as a chip X size, a chip Y size, and a chip Z size. In step S103, the address converting unit 11 converts a logical address of a detected failure cell into a physical address on a chip based on the logical address-to-physical address conversion information included in the memory configuration information 41. The following steps S104 to S108 are performed by the image data generating unit 12. In step S104, with reference to the image generation master (layer) 43, the image data generating unit 12 checks whether the definition of a target product is present. When the definition of a target product is not present in the image generation master (layer) 43 (No in step S104), the image data generating unit 12 generates FBM image data separately with respect to all the layers described in the memory configuration information 41 (step S105). For example, in FIG. 10, since a product "CCCCCCC" has no product definition in the image generation master 43, when the chip Z size in the memory configuration information of the product "CCCCCCC" is 16, 16 images from Layer 0 to Layer 15 are generated separately. When the definition of a target product is present in the image generation master (layer) 43 (Yes in step S104), the image data generating unit 12 further checks whether a plurality of layers are collectively defined in the definition of the image generation master (layer) 43 (step S106). Like "1+2+3+4+5+6" of a product "BBBBBBB" of FIG. 10, the definition using a sign "+" is the collective definition of a plurality of layers. When a plurality of layers are not collectively defined (No in step S106), the image data generating unit 12 generates FBM image data separately with respect to all layers "0, 1, 2 and 3" in the case of a product "AAAAAAA" of FIG. 10 (step S107). When a plurality of layers are collectively defined (Yes in step S106), the image data generating unit 12 generates image data by overlapping the collectively-defined layers with each other and retains the same as initial display FBM image data (step S108). Accordingly, the waste caused when FBM image data are generated separately with respect to all layers can be reduced. After steps S105, S107 and S108, the management information registering unit 13 registers information of the image data (layer) generated in the FBM data management table 62, specifically, information about a plurality of layers collected to generate the image data (step S109).

Figure 17:
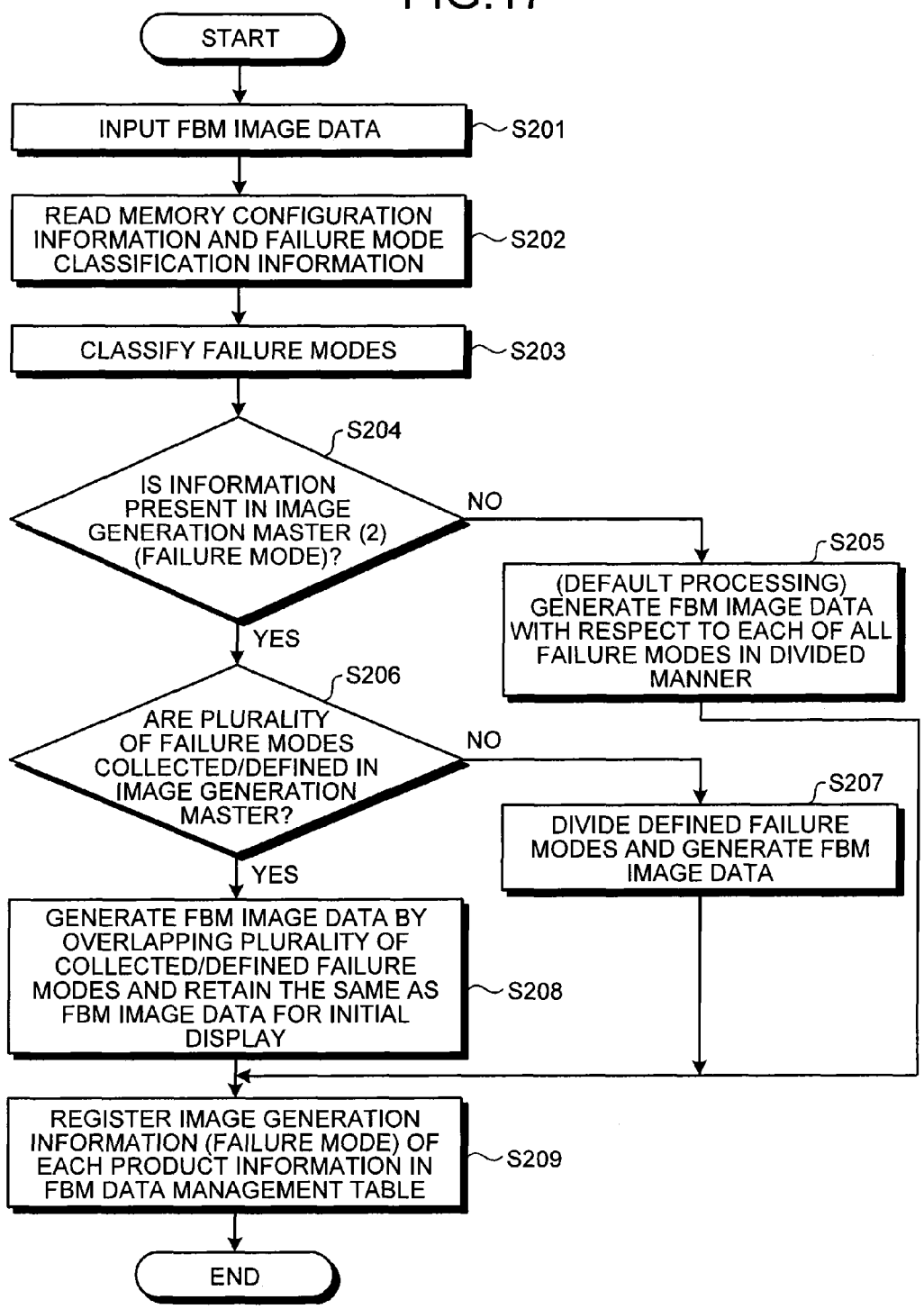
FIG. 17 is a diagram illustrating an example of a failure mode classification flow according to Embodiment 1.

FIG. 17 illustrates an example of a failure mode classification flow according to Embodiment 1. In step S201, the failure mode classifier 20 inputs FBM image data from the layer-by-layer FBM image data 61 into the failure mode classifying unit 21. In step S202, the failure mode classifying unit 21 reads memory configuration information 41 (FIG. 9) such as a chip X size, a chip Y size, and a chip Z size, and the failure mode classification information 42 (FIG. 9). In step S203, the failure mode classifying unit 21 classifies failure modes according to the failure mode classification information 42. The following steps S204 to S208 are performed by the image data generating unit 22. In step S204, with reference to the image generation master (failure mode) 44, the image data generating unit 12 checks whether the definition of a target product is present. When the definition of a target product is not present in the image generation master (layer) 44 (No in step S204), the image data generating unit 12 generates FBM image data separately with respect to all failure modes of the failure mode classification information 42 (step S205). When the definition of a target product is present in the image generation master (failure mode) 44 (Yes in step S204), the image data generating unit 12 checks whether a plurality of failure modes are collectively defined in the definition of the image generation master (failure mode) 44 (step S206). Like "Mode1+Mode2+Mode3" of a product "BBBBBBB" of FIG. 11, the definition using a sign "+" is the collective definition of a plurality of failure modes. When a plurality of failure modes are not collectively defined (No in step S206), the image data generating unit 12 generates FBM image data separately with respect to 10 failure modes "Mode1" to "Mode10" in the case of a product "AAAAAAA" of FIG. 11 (step S207). When a plurality of failure modes are collectively defined (Yes in step S206), the image data generating unit 12 generates image data by overlapping the collectively-defined failure modes with each other and retains the same as initial display FBM image data (step S208). Accordingly, the waste caused when FBM image data are generated separately with respect to all failure modes can be reduced. After steps S205, S207 and S208, the management information registering unit 23 registers information of the image data (failure mode) generated in the FBM data management table 62, specifically, information about a plurality of failure modes collected to generate the image data (step S209).

Figure 18:
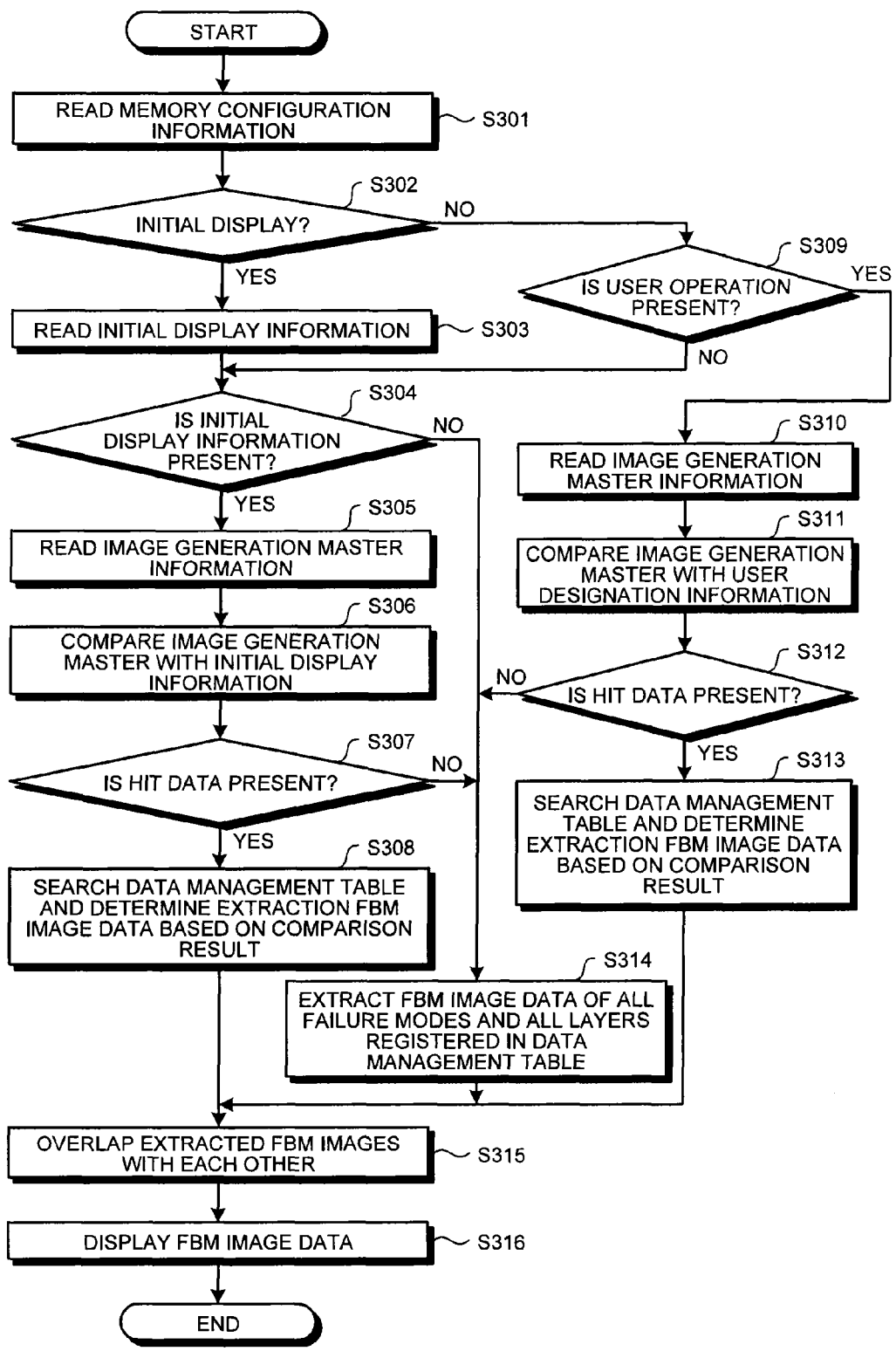
FIG. 18 is a diagram illustrating an example of an FBM display flow according to Embodiment 1.

FIG. 18 illustrates an example of an FBM display flow according to Embodiment 1. In step S301, the master information read unit 31 reads memory configuration information 41 (FIG. 9) such as a chip X size, a chip Y size, and a chip Z size. Next, in step S302, the FBM display section 30 determines whether the display is an initial display. When the display is an initial display (Yes in step S302), the initial display information setting unit 32 reads, for example, the initial display information (layer) 51 and the initial display information (failure mode) 52 illustrated in FIGS. 14 and 15 from the FBM initial display information retaining unit 50 (step S303). When the initial display information illustrated in FIGS. 14 and 15 is not present (No in step S304), the image data extracting unit 34 extracts the FBM image data of all failure modes and all layers registered in the FBM data management table 62 (step S314). When the initial display information illustrated in FIGS. 14 and 15 is present (Yes in step S304), the master information read unit 31 reads the image generation master (layer) 43 and the image generation master (failure mode) 44, illustrated in FIGS. 10 and 11, as the image master information (step S305). In step S306, the display information comparing unit 33 compares the image generation master (layer) 43 and the image generation master (failure mode) 44 with the initial display information (layer) 51 and the initial display information (failure mode) 52 and determines whether the definition of a target product is present (hit) in the image generation master (layer) 43 and the image generation master (failure mode) 44 (step S307). When the definition of a target product, that is, hit data is not present (No in step S307), the image data extracting unit 34 extracts the FBM image data of all failure modes and all layers registered in the FBM data management table 62 (step S314). That is, the image data extracting unit 34 extracts the FBM image data of all layers and all failure modes and the FBM image data of each failure mode.

When the definition of a target product, that is, hit data is present (Yes in step S307), the FBM data management table 62 is searched to determine the FBM image data extracted by the image data extracting unit 34, based on the comparison results of the image generation master information and the initial display information (hit data), that is, the target product having a definition in the image generation master (layer) 43 and the image generation master (failure mode) 44 (step S308). A specific example of the method of obtaining the hit data will be described below. For example, when the image generation master (layer) 43 of FIG. 10 is compared with the initial display information (layer) 51 of FIG. 14, the comparison result of the product "AAAAAAA" is "0". As for the product "BBBBBB", since "5" of the initial display information (layer) 51 is included in "1+2+3+4+5+6" in the image generation master (layer) 43, the hit data is "0, 1+2+3+4+5+6". Also, when the image generation master (failure mode) 44 of FIG. 11 is compared with the initial display information (failure mode) 52 of FIG. 15, the hit data of the product "AAAAAAA" is "Mode1, Mode5, Mode10". As for the product "BBBBBB", since "Mode6" of the initial display information (failure mode) is not present in the image generation master (failure mode) 44, the hit data is "Mode1+Mode2+Mode3". In this case, "Mode6" is not displayed. In the above example, the definition represented in the initial display information is displayed when collected in the image generation master, and the initial display information that is not present in the image generation master cannot be displayed. Also, when no initial display information is described in the image generation master, that is, when there is no hit data (No in step S307), the FBM display flow proceeds to step S314 as described above. However, the above hit data selecting method is merely exemplary, and the present invention is not limited thereto. Based on the hit data, the FBM data management table 62 is searched and the FBM image data extracted by the image data extracting unit 34 is determined.

When the display is not an initial display in step S302 (No in step S302), whether a user operation is present is determined in step S309. The case where a user operation is present (Yes in step S309) is, for example, the case where user designation information is given, for example, when the user adds a selection item in a layer selection screen, a failure mode selection screen, or a screen displaying both. In this case, the master information read unit 31 reads the image generation master (layer) 43 and the image generation master (failure mode) 44, illustrated in FIGS. 10 and 11, as the image master information (step S310). In step S311, the display information comparing unit 33 compares the image generation master (layer) 43 and the image generation master (failure mode) 44 with the above-described user designation information and determines whether the definition of a target product is present (hit) in the image generation master (layer) 43 and the image generation master (failure mode) 44 (step S312). When the definition of a target product, that is, hit data is not present (No in step S312), the image data extracting unit 34 extracts the FBM image data of all failure modes and all layers registered in the FBM data management table 62, that is, the FBM image data of all layers and all failure modes and the FBM image data of each failure mode (step S314).

When the definition of a target product, that is, hit data is present (Yes in step S312), the FBM data management table 62 is searched to determine the FBM image data extracted by the image data extracting unit 34, based on the comparison results of the image generation master information and the user designation information (hit data), that is, the target product having a definition in the image generation master (layer) 43 and the image generation master (failure mode) 44 (step S313). A hit data determining method is the same as that described in step S307. Also, when a user operation is not present (No in step S309), the FBM display flow proceeds to step S304.

After step S308, S313 and S314, the image data combining unit 35 overlaps the FBM image data extracted by the image data extracting unit 34 (step S315), and the FBM/3D display unit 36 displays the overlapped FBM image data last (step S316).

In Embodiment 1, the FBM generation flow of FIG. 16 is performed first, the failure mode classification flow of FIG. 17 is performed next, and the FBM display flow of FIG. 18 is performed last. However, the respective flows may be performed independently.

Figure 19A:
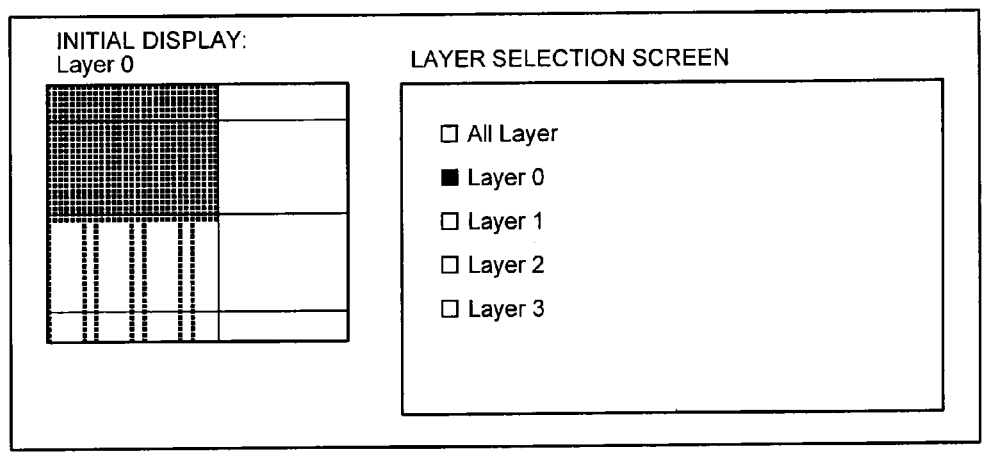
FIGS. 19A and 19B are diagrams illustrating an example of a FBM display in each layer according to Embodiment 1.
Figure 19B:
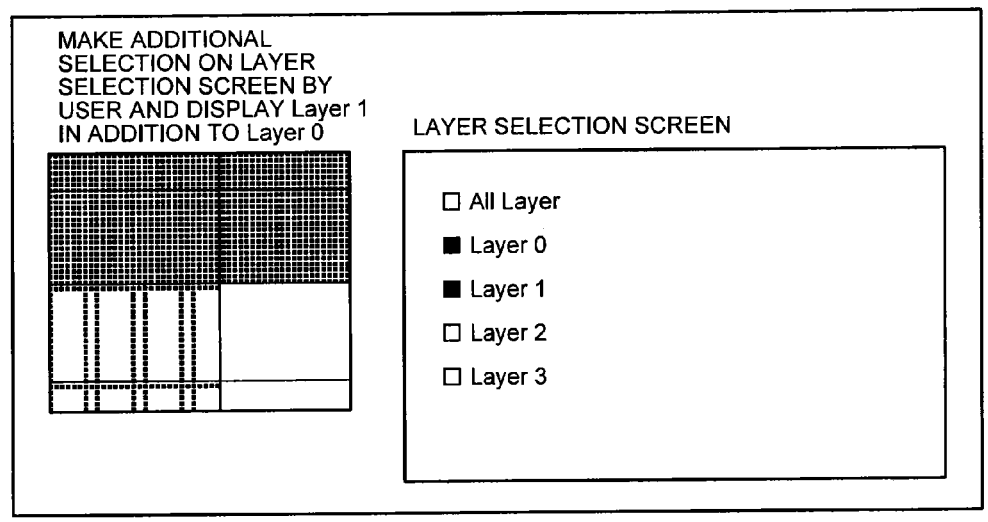

FIGS. 19A and 19B illustrate an example of an FBM display for each layer. Layer0 to Layer3 are registered in the image generation master (layer) 43 and the FBM data management table 62, but "Layer0" is registered in the initial display information (layer) 51. FIG. 19A illustrates an FBM and a layer selection screen in an initial display. Herein, FBM of "Layer0" is displayed, and "Layer0" is selected in the layer selection screen. FIG. 19B illustrates an example in which the user additionally selects "Layer1" in the layer selection screen after the initial display and re-displays the FBM, in which the FBMs of Layer0 and Layer1 are displayed in an overlapped manner. When "Layer1" is additionally selected from the layer selection screen, the image data extracting unit 34 of FIG. 9 extracts image data of "Layer1" from the FBM image data. The image data combining unit 35 overlaps the pre-extracted image data of "Layer0" and "Layer1" with each other, and the FBM/3D display unit 36 displays the overlapped FBM image data.

Figure 20A:
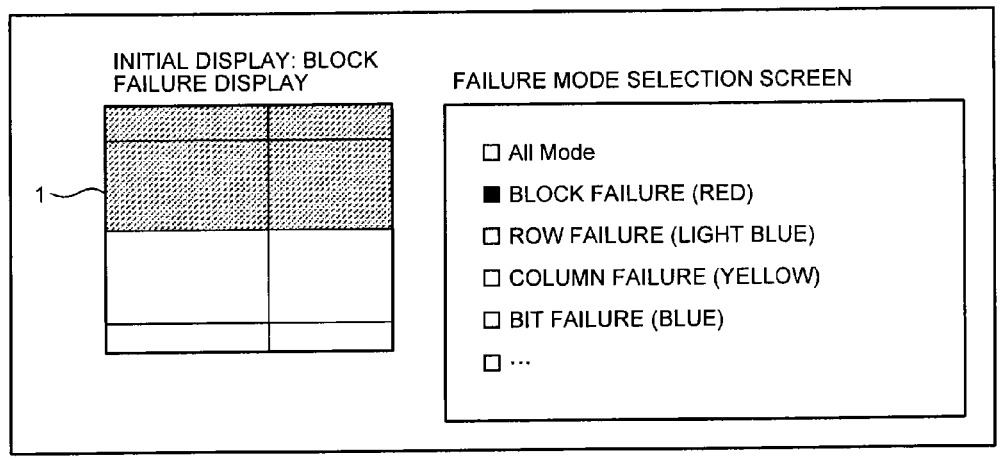
FIGS. 20A and 20B are diagrams illustrating an example of an FBM display in each failure mode according to Embodiment 1.
Figure 20B:
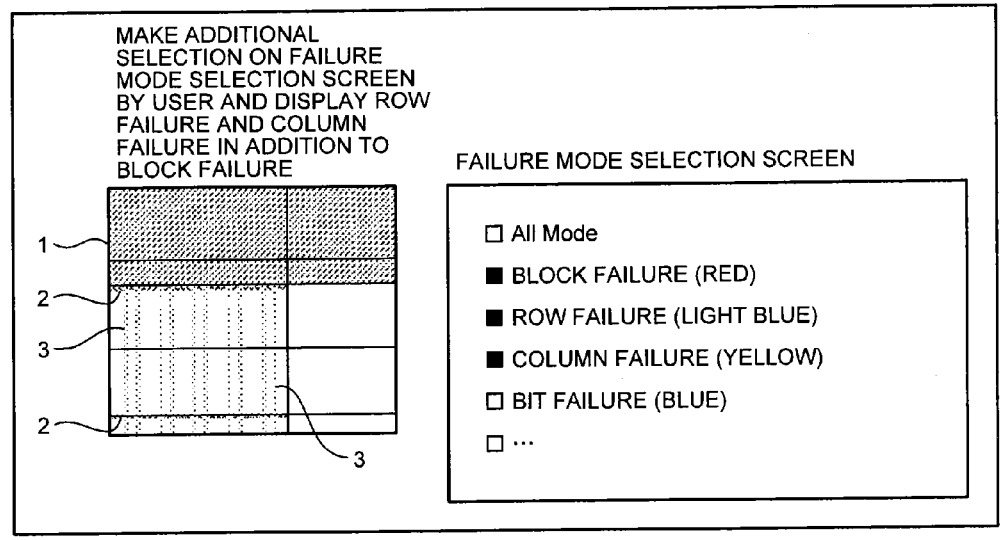

FIGS. 20A and 20B illustrate an example of an FBM display for each failure mode. A block failure 1, a row failure 2, a column failure 3 and a bit failure are registered in the image generation master (layer) 44 and the FBM data management table 62, but a "block failure" is registered in the initial display information (failure mode) 52. FIG. 20A illustrates an FBM for each failure mode (discriminated by color) and a failure mode selection screen in an initial display. Herein, an FBM of "Block Failure (Red)" is displayed, and "Block Failure (Red)" is selected in the failure mode selection screen. FIG. 20B illustrates an example in which the user additionally selects "Row Failure (Light Blue)" and "Column Failure (Yellow)" in the failure mode selection screen after the initial display and re-displays the FBM, in which the FBMs of the block failure 1, the row failure 2 and the column failure 3 are displayed in an overlapped manner. In FIGS. 20A and 20B, the failure modes are discriminated by color.

FIGS. 21A and 21B illustrate an example of an FBM display for each layer and for each failure mode. Layer0 to Layer3, a block failure 1, a row failure 2, a column failure 3 and a bit failure are registered in the image generation master (layer) 43 and the image generation master (failure mode) 44 and the FBM data management table 62, but "Layer0 and Block Failure" are registered in the initial display information (layer) 51 and the initial display information (failure mode) 52. In this case, in the initial display, an FBM is displayed by designating a layer and a failure mode based on the initial display information (layer) 51 and the initial display information (failure mode) 52. FIG. 21A illustrates an FBM, a layer selection screen and a failure mode selection screen in an initial display. Herein, an FBM of "Layer0 and Block Failure" for each failure mode (discriminated by color) is displayed, "Layer0" is selected in the layer selection screen, and "Block Failure (Red)" is selected in the failure mode selection screen. FIG. 21B illustrates an example in which, after the initial display, the user selects "All Layers" in the layer selection screen, additionally selects "Row Failure (Light Blue), Column Failure (Yellow)" in the failure mode selection screen, and re-displays the FBM, in which the FBMs of the block failure 1, the row failure 2 and the column failure 3 of all layers are displayed in an overlapped manner. Three-dimensional (3D) display can indicate that all layers are displayed. In FIGS. 21A and 21B, the failure modes are discriminated by color.

As described above, in the semiconductor device failure analysis system 100 and the failure analysis method according to Embodiment 1, the fail bit data of the semiconductor memory having a three-dimensional (3D) structure is divided according to the respective layers in the Z-axis direction to generate fail bit map data, and only image data of one or more specific layers is displayed at high speed in the initial display. Also, in the initial display of the fail bit map discriminating the respective failure modes by color, all failure modes are not displayed in an overlapped manner, and only image data of one or more specific failure modes is displayed at high speed. Also, the respective functional units illustrated in FIG. 9 may be distributed on a distributed server or a cloud. That is, the semiconductor device failure analysis system 100 according to Embodiment 1 may be implemented by distributing the respective functional units in a single device or in a plurality of devices.

Under the condition of the occurrence of a sudden failure, or under the condition of the frequent occurrence of a specific failure, a method of initially displaying a failure mode with many failures without using predetermined initial display information (failure mode) in the FBM display of each failure mode is effective. Since a failure mode with many failures is initially displayed, the initial display failure mode changes dynamically by wafers.

Figure 22:
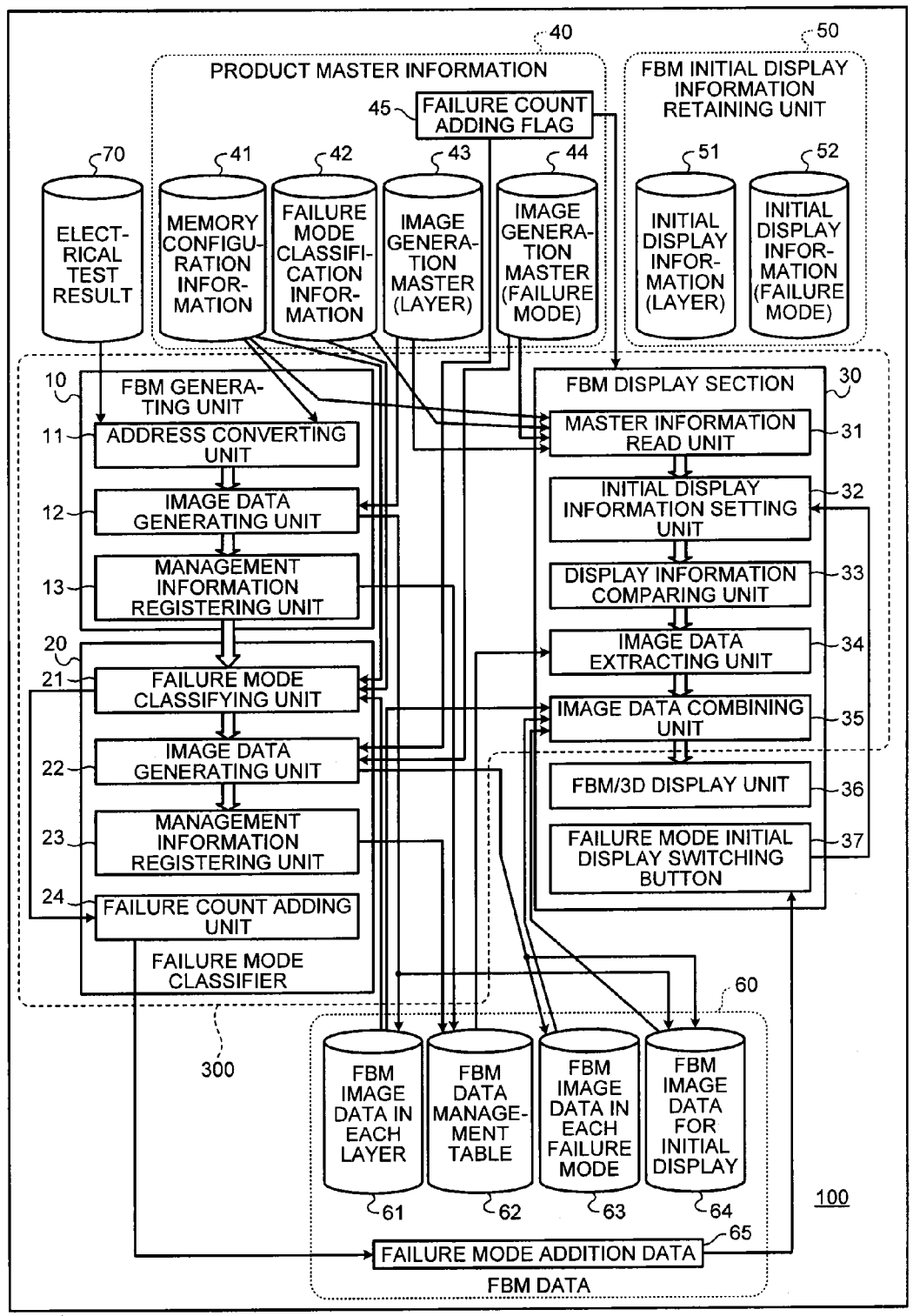
FIG. 22 is a diagram illustrating another example of the configuration of a semiconductor device failure analysis system according to Embodiment 1.

FIG. 22 illustrates an example in which a configuration condition is added to the configuration of the semiconductor device failure analysis system 100 of FIG. 9 in order to initially display a failure mode with many failures. In FIG. 22, in the configuration of the semiconductor device failure analysis system 100, a failure count addition flag 45 is added in the product master information 40, a failure count adding unit 24 is added to the end of the failure mode classifier 20, failure mode addition data 65 is added in the FBM data 60, and a failure mode initial display switching button 37 is added to the FBM display section 30. When the failure count addition flag 45 is off, an initial display is performed based on the image generation master (failure mode) 44 and the initial display information (failure mode) 52 as described above, and when the failure count addition flag 45 is on and the failure mode initial display switching button 37 is pressed down, upper five failure modes with many failures are initially displayed as described below.

The case where the failure count addition flag 45 is on will be described in detail. The failure mode classifying unit 21 inputs FBM image data for each chip and classifies a failure mode in each failure bit configuration. The image data generating unit 22 generates FBM image data separately with respect to all failure modes of the failure mode classification information without referring to the image generation master (failure mode) 44, and the management information registering unit 23 registers information of the generated image data.

In the failure count adding unit 24, the failure mode classification result of all chips on the same wafer (the failure occurrence count in each failure mode) is added with respect to each failure mode, and "Wafer Identifier, Upper Five Failure Modes and Failure Occurrence Count" is registered as the failure mode addition data 65. In the FBM display section 30, when the failure mode initial display switching button 37 is activated when there is failure mode addition data 65 of a wafer designated by the user. When the failure mode initial display switching button 37 is pressed down, FBMs of upper five failure modes with many failures are initially displayed based on the failure mode addition data 65.

Embodiment 2

In Embodiment 1, the initial display information is previously defined in the system. Alternatively, the initial display information (for example, upper five failure modes) is set dynamically according to the failure occurrence modes. When a plurality of initial display layers and failure modes are set, image data is generated by overlapping them with each other in the system. However, in Embodiment 2, an engineer explicitly sets initial display information in a test mode, and includes the initial display information in the tester output data.

That is, according to the test result, in order to set a layer with many failures (with a high failure occurrence frequency) as an initial display layer to the output data, the initial display information is added in the test program, and the initial display information is added into the test output data in a test mode. The system sets initial display information based on the initial display information included in the test output data.

FIG. 23 illustrates an example of the initial display layer information in the tester output data. For example, in a tester, in the case where product information of a test target, a test name, a test date, and the like are output in a text file, the tailing 10 digits of the filler unit are allocated and used as the initial display layer information.

Figure 24:
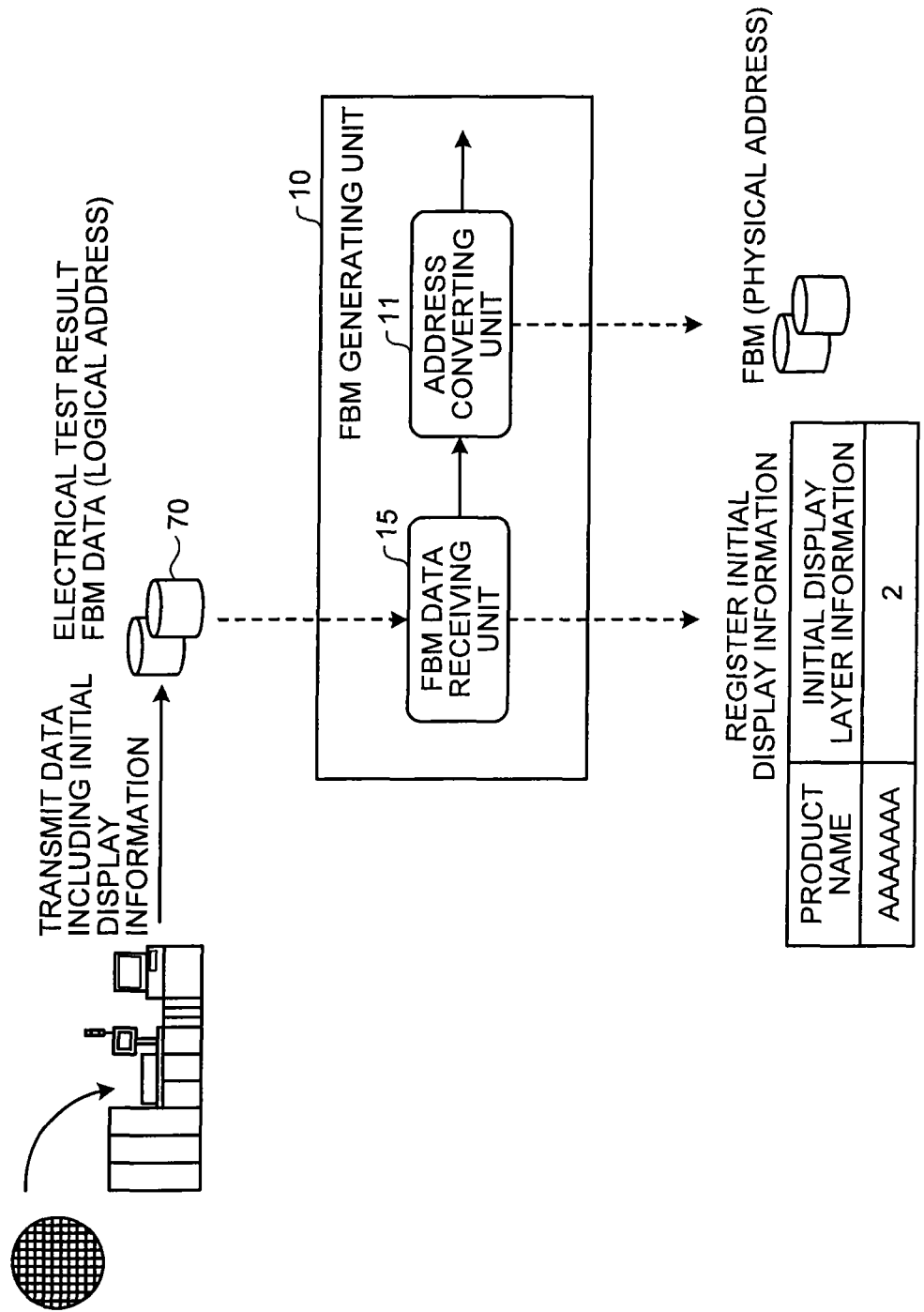
FIG. 24 is a diagram illustrating an example of the use of initial display layer information in tester output data according to Embodiment 2.

FIG. 24 illustrates an example of the use of the initial display layer information in the tester output data. In the tester, the engineer explicitly sets initial display information in a test mode and adds the initial display information in the test output data. Also, in order to set a layer with many failures as an initial display layer to the output data, the initial display information is added in the test program, and the initial display information is added into the test output data in a test mode.

In the system side, an FBM data receiving unit 15 is additionally provided in the FBM generating unit 10 of the configuration of the semiconductor device failure analysis system of FIG. 9, and initial display information is set based on the initial display information included in the test output data. Accordingly, instead of setting the initial display information by the system side, the tester side can set the initial display information by the test condition or the failure occurrence mode.

In addition, by adding a circuit for outputting overlapped data of a plurality of layers to the device, the following application can be implemented.

That is, instead of outputting Pass/Fail information of a plurality of layers in the test operation, for example, by adding a circuit for outputting the Pass/Fail information after performance of an AND/OR operation, the operated Pass/Fail information of a plurality of layers is output, FBM image data is generated in the system, and the operated layer is initially displayed.

Figure 25:
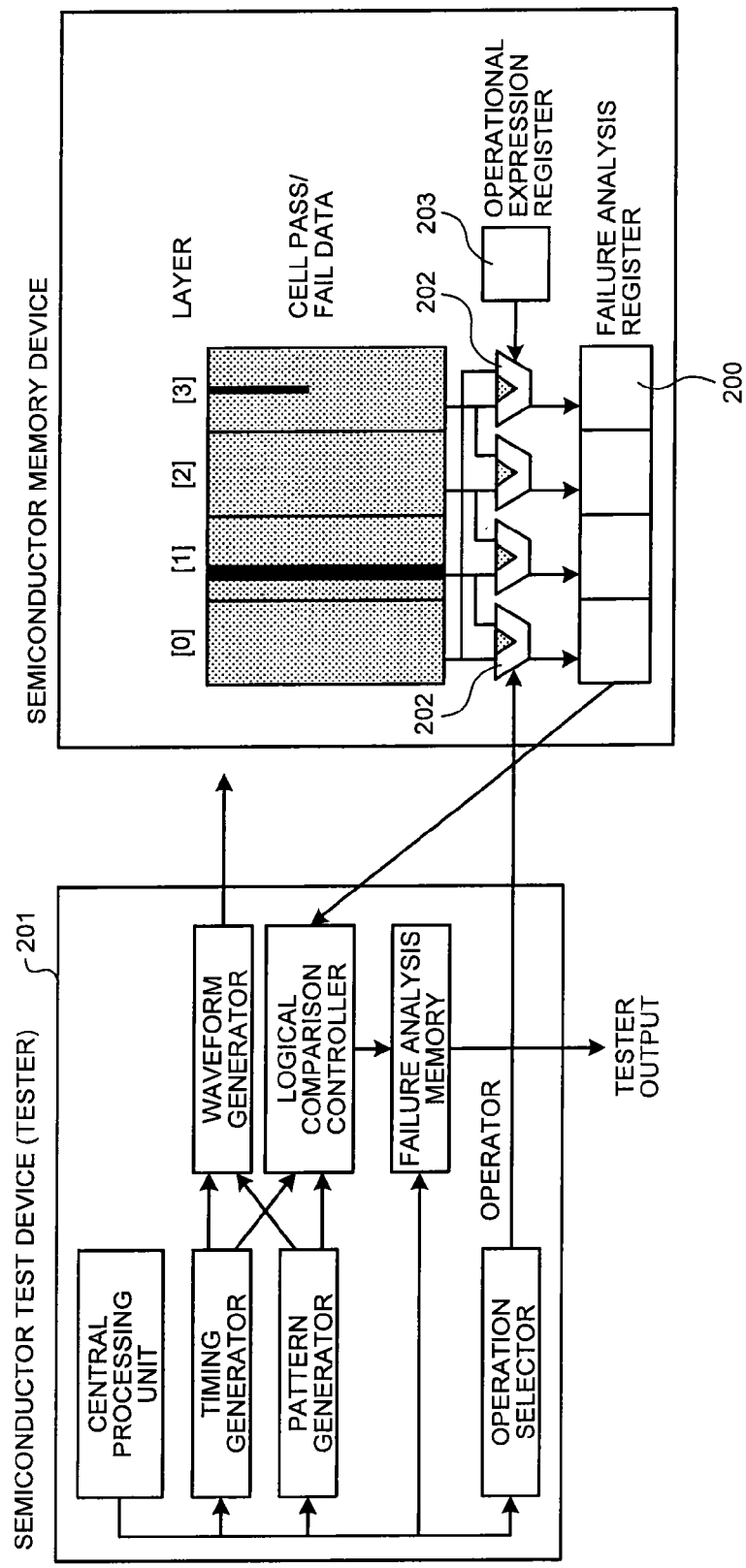
FIG. 25 is a diagram illustrating an example of a semiconductor memory device according to Embodiment 2.

FIG. 25 illustrates an example of a semiconductor memory device. The semiconductor memory device includes a failure analysis register 200 (failure analysis unit) and a logical operation circuit ALU (Arithmetic Logic Unit) 202 into which cell pass/fail information of a plurality of layers is input. In general, the logical operation circuit ALU 202 does not perform any operation, and the failure analysis register 200 retains cell pass/fail data measured in each layer. In this case, the cell pass/fail data of each layer is output from the failure analysis register 200 (failure analysis unit) to the tester.

Herein, the logical operation circuit ALU 202 installed at the front end of the failure analysis register 200 outputs, for example, the result of an AND operation or an OR operation on the cell pass/fail information of each of the plurality of layers to the failure analysis register 200, so that the operation result of the pass/fail information of the plurality of layers can be output from the semiconductor memory device to the tester. Specifically, for example, when a AND operation is performed on the fail of cells located at the same 2D coordinates in Layer0 and Layer1, a failure throughout both layers (that is, across both layers) can be obtained as the operation result. Also, for example, when an OR operation is performed on the fail of cells located at the same 2D coordinates in Layer0 and Layer1, data corresponding to an overlap of the failures of both layers (for example, data corresponding to FIG. 6) can be obtained as the operation result. This operation can be implemented when the pass/fail information of cells located at the same 2D coordinates in the respective layers is obtained in parallel in the failure analysis. The layer and the operator of an operation target may be input from the tester, or may be retained and stored in an operational expression register 203. When the test result is output from the tester, "0and1" indicating the use of the AND operation result of Layer0 and Layer1 as the initial display information or "0OR1" indicating the use of the OR operation result of Layer0 and Layer1 as the initial display information is described and output in the initial display layer information (tailing 10 digits) in the tester output data of FIG. 23. Accordingly, as illustrated in FIG. 24, an operation result FBM is registered as the initial display information in the FBM data receiving unit 15, the operation result is converted into an FBM in the address converting unit 11, and the result can be registered and initially displayed. That is, the output result of the semiconductor memory device of FIG. 25 can be initially displayed directly.

In analyzing the fail bit map (FBM) of the semiconductor memory having a three-dimensional (3D) structure, what is effective is a method that initially displays the fail bit map of the most important uppermost and lowermost layers to detect the condition of the wafer, and displays the fail bit map of the intermediate layer and the fail bit map of each layer according to circumstances to detect the detailed conditions. Also, in analyzing the FBM failure mode of the semiconductor memory having a three-dimensional (3D) structure, it is necessary to determine a three-dimensional (3D) failure mode throughout all of a plurality of layers that is caused by the failure factor in the stacking (Z-axis) direction. Therefore, what is effective is a method that initially displays the most important three-dimensional (3D) failure mode to detect a bottleneck failure and then displays the two-dimensional (2D) failure mode as necessary to detect the detailed conditions. By the semiconductor device failure analysis system 100 according to the embodiments described above, the display of the fail bit map (FBM) can be accelerated by initially displaying the most important layer and the most important failure mode. In addition, by restricting the initial display as above, the risk of missing the important failure can be reduced. Also, by initially detecting the important failure, the device analysis time can be shortened. In addition, the time taken to feed back the analysis result as the process condition can be reduced, and the yield can be rapidly increased.

(Supplement 1)

A semiconductor device failure analysis system including:

an image data generating unit that generates a fail bit map based on failure analysis result data of a semiconductor memory cell having a three-dimensional structure and configuration information of the semiconductor memory cell;

an initial display information retaining unit that retains initial display information data describing a type of image data to be initially displayed;

a comparing unit that compares a type of the fail bit map which is generated with the initial display information data; and a display unit that initially displays a portion of the fail bit map based on the comparison result of the comparing unit.

(Supplement 2)

The semiconductor device failure analysis system according to Supplement 1, wherein the type of the image data described in the initial display information data is a layer, image data of which is to be generated.

(Supplement 3)

The semiconductor device failure analysis system according to Supplement 1 or 2, wherein the type of the image data described in the initial display information data is a failure mode, image data of which is to be generated.

(Supplement 4)

The semiconductor device failure analysis system according to Supplement 1 or 2, wherein the failure analysis result data includes information of a layer having a high failure occurrence frequency, and the initial display information data is generated based on the information of the layer having a high failure occurrence frequency.

(Supplement 5)

The semiconductor device failure analysis system according to Supplement 4, wherein the information of the layer having a high failure occurrence frequency is generated based on data output by a failure analysis unit connected to the semiconductor memory cell.

(Supplement 6)

The semiconductor device failure analysis system according to any one of Supplements 1 to 5, wherein the image data generating unit generates a collected fail bit map with respect to a plurality of layers based on image generation master data.

(Supplement 7)

The semiconductor device failure analysis system according to any one of Supplements 1 to 6, wherein the image data generating unit generates a collected fail bit map with respect to a plurality of failure modes based on image generation master data.

(Supplement 8)

The semiconductor device failure analysis system according to Supplement 6, further including a management information registering unit managing information about a plurality of layers collected to generate image data, wherein the comparing unit performs the comparison by using the information managed by the management information registering unit.

(Supplement 9)

The semiconductor device failure analysis system according to Supplement 7, further including a management information registering unit managing information about a plurality of failure modes collected to generate image data, wherein the comparing unit performs the comparison by using the information managed by the management information registering unit.

(Supplement 10)
A semiconductor device failure analysis system including:
an image data generating unit that generates a fail bit map based on failure analysis result data of a semiconductor memory cell having a three-dimensional structure, configuration information of the semiconductor memory cell, and a type of a failure mode;
a failure count adding unit that records a failure occurrence count of each failure mode based on the failure analysis result data; and
a display unit that initially displays a portion of the fail bit map related to a failure mode of a high failure occurrence frequency based on the failure occurrence count of each failure mode.

(Supplement 11)
The semiconductor device failure analysis system according to any one of Supplements 1 to 10, wherein the display unit displays a fail bit map of each failure mode discriminatively by color.

(Supplement 12)
A semiconductor device failure analysis method including:
a process of generating failure analysis result data of a semiconductor memory cell having a three-dimensional structure;
a process of generating a fail bit map based on the failure analysis result data and configuration information of the semiconductor memory cell;
a process of comparing a type of the fail bit map which is generated with initial display information data describing a type of image data to be initially displayed; and
a process of initially displaying a portion of the fail bit map based on the comparison result.

(Supplement 13)
The semiconductor device failure analysis method according to Supplement 12, wherein the type of the image data described in the initial display information data is a layer, image data of which is to be generated.

(Supplement 14)
The semiconductor device failure analysis method according to Supplement 12 or 13, wherein the type of the image data described in the initial display information data is a failure mode, image data of which is to be generated.

(Supplement 15)
The semiconductor device failure analysis method according to Supplement 12, wherein in the process of generating the failure analysis result data, information of a layer having a high failure occurrence frequency is included in the failure analysis result data, and the initial display information data is generated based on the information of the layer having a high failure occurrence frequency.

(Supplement 16)
The semiconductor device failure analysis method according to any one of Supplements 12 to 15, wherein in the process of generating the fail bit map, a collected fail bit map is generated with respect to a plurality of layers based on image generation master data.

(Supplement 17)
The semiconductor device failure analysis method according to any one of Supplements 12 to 16, wherein in the process of generating the fail bit map, a collected fail bit map is generated with respect to a plurality of failure modes based on image generation master data.

(Supplement 18)
A semiconductor device failure analysis method including:
a process of generating failure analysis result data of a semiconductor memory cell having a three-dimensional (3D) structure;
a process of generating a fail bit map based on the failure analysis result data, configuration information of the semiconductor memory cell, and the type of failure mode;
a process of recording a failure occurrence count of each failure mode based on the failure analysis result data; and
a process of initially displaying a portion of the fail bit map related to a failure mode of a high failure occurrence frequency based on the failure occurrence count of each failure mode.

(Supplement 19)
The semiconductor device failure analysis method according to any one of Supplements 12 to 18, wherein in the process of initially displaying the portion of the fail bit map, a fail bit map of each failure mode is initially displayed discriminatively by color.

(Supplement 20)
A semiconductor memory device including:
a semiconductor memory cell having a three-dimensional structure;
an operation unit configured to perform a logical operation between the failure analysis results of the semiconductor memory cell obtained with respect to each layer; and
a failure analysis register that retains the operation result of the operation unit.

(Supplement 21)
The semiconductor memory device according to Supplement 20, wherein the operation unit performs an OR operation between the failure analysis results of the semiconductor memory cell obtained with respect to each layer.

(Supplement 22)
The semiconductor memory device according to Supplement 20, wherein the operation unit performs an AND operation between the failure analysis results of the semiconductor memory cell obtained with respect to each layer.

(Supplement 23)
The semiconductor memory device according to any one of Supplements 20 to 22, further including a register retaining an operator and a layer corresponding to an operation target of the operation unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Structure of the memory cell array is not limited as above description. A memory cell array formation may be disclosed in U.S. patent application Ser. No. 12/532,030 filed on Mar. 23, 2009. U.S. patent application Ser. No. 12/532,030, the entire contents of which are incorporated by reference herein.

Furthermore A memory cell array formation may be disclosed in U.S. patent application Ser. No. 12/679,991 filed on Mar. 25, 2010. U.S. patent application Ser. No. 13/236,734, the entire contents of which are incorporated by reference herein. We may modify the memory cell array of FIG. 1 and FIG. 9 in Ser. No. 13/236,734 so that the memory cell array is formed above the semiconductor substrate.

In particular, a conductive layer is formed above the semiconductor substrate. The memory cell array is formed on the conductive layer. A peripheral circuit including a sense amplifier circuit is formed below the memory cell array and formed on the semiconductor substrate. We may apply Embodiment 1 and Embodiment 2 to memory device including the modified memory cell array.

What is claimed is:

1. A semiconductor device failure analysis system comprising:
   a memory configured to be capable of retaining an initial display information and an image generation master, the initial display information indicating a type of an initially displaying image data, and the image generation master indicating a type of a generating image data with respect to a semiconductor device including a three-dimensional memory cell array;
   a control unit configured to generate a first image based on a configuration information of the semiconductor device and a plurality of fail bit information of the semiconductor device, and to compare the image generation master and the initial display information to determine a second image, the second image being a type of an image data common to the image generation master and the initial display information and corresponding to part of the plurality of fail bit information; and
   a display configured to be capable of initially displaying the second image.

2. The semiconductor device failure analysis system according to claim 1, wherein the initial display information includes layer information.

3. The semiconductor device failure analysis system according to claim 2, wherein the plurality of fail bit information includes information of a layer having a high failure occurrence frequency, and the initial display information is generated based on the information of the layer having a high failure occurrence frequency.

4. The semiconductor device failure analysis system according to claim 2, wherein the control unit generates a third image which is collected information with respect to a plurality of layers based on the image generation master, data and
   the image generation master includes:
      information that restricts a layer and/or a failure mode, the layer and/or the failure mode generating a fail bit map, or
      information that instructs generation of one image by overlapping a plurality of the fail bit maps of a plurality of the layers and/or a plurality of the failure modes.

5. The semiconductor device failure analysis system according to claim 1, wherein the initial display information includes failure mode information.

6. The semiconductor device failure analysis system according to claim 2, wherein the initial display information includes failure mode information.

7. The semiconductor device failure analysis system according to claim 1, wherein the plurality of fail bit information includes information of a layer having a high failure occurrence frequency, and the initial display information is generated based on the information of the layer having a high failure occurrence frequency.

8. The semiconductor device failure analysis system according to claim 1, wherein the control unit generates a third image which is collected information with respect to a plurality of failure modes based on the image generation master, and
   the image generation master includes:
      information that restricts a layer and/or a failure mode, the layer and/or the failure mode generating a fail bit map, or
      information that instructs generation of one image by overlapping a plurality of the fail bit maps of a plurality of the layers and/or a plurality of the failure modes.

9. The semiconductor device failure analysis system according to claim 8, the control unit further configured to manage information about a plurality of failure modes collected to generate the third image,
   wherein the control unit generates the second image by using the information about a plurality of failure modes collected to generate the third image.

10. The semiconductor device failure analysis system according to claim 1, wherein the display displays the second image of each failure mode discriminatively by color.

11. The semiconductor device failure analysis system according to claim 1, wherein the control unit generates a third image which is collected information with respect to a plurality of layers based on the image generation master, data and
   the image generation master includes:
      information that restricts a layer and/or a failure mode, the layer and/or the failure mode generating a fail bit map, or
      information that instructs generation of one image by overlapping a plurality of the fail bit maps of a plurality of the layers and/or a plurality of the failure modes.

12. The semiconductor device failure analysis system according to claim 11, the control unit further configured to manage information about a plurality of layers collected to generate the third image,
   wherein the control unit generates the second image by using the information about a plurality of layers collected to generate the third image.

13. A semiconductor device failure analysis system comprising:
   a memory configured to be capable of retaining an initial display information, an image generation master, and a failure count addition flag, the initial display information indicating a type of an initially displaying image data, the image generation master indicating a type of a generating image data with respect to a semiconductor device including a three-dimensional memory cell array, and the failure count addition flag indicating whether or not to execute a failure occurrence count;
   a control unit configured to generate a first image based on a configuration information of the semiconductor device, a plurality of fail bit information of the semiconductor device, and a type of a failure mode; and to generate a second image; and
   a display unit that initially displays the second image, wherein
   in a case the failure count addition flag is on, the control unit is configured to record the failure occurrence count of each failure mode based on the plurality of fail bit information, and to generate the second image from the first image related to a failure mode of a high failure occurrence frequency based on the failure occurrence count of each failure mode,
   in a case the failure count addition flag is off, the control unit is configured to compare the image generation master and the initial display information to determine the second image, the second image being a type of an image data common to the image generation master and the initial display information and corresponding to part of the plurality of fail bit information.

14. The semiconductor device failure analysis system according to claim 13, wherein the display unit displays the second image of each failure mode discriminatively by color.

15. A semiconductor memory device comprising:
a semiconductor memory cell having a three-dimensional structure;
an operation unit configured to perform a logical operation between failure analysis results of the semiconductor memory cell obtained with respect to each layer; and
a failure analysis register that retains the operation result of the operation unit, wherein
the operation unit includes
a logical operation circuit into which cell pass/fail information of each of a plurality of layers is input, and
an operational expression register retaining a layer and an operator of an operation target that are used by the logical operation circuit.

16. The semiconductor memory device according to claim 15, wherein the operation unit performs an OR operation between the failure analysis results of the semiconductor memory cell obtained with respect to each layer.

17. The semiconductor memory device according to claim 15, wherein the operation unit performs an AND operation between the failure analysis results of the semiconductor memory cell obtained with respect to each layer.

* * * * *